(12) United States Patent
Usui

(10) Patent No.: US 8,860,227 B2
(45) Date of Patent: Oct. 14, 2014

(54) SEMICONDUCTOR SUBSTRATE HAVING DOT MARKS AND METHOD OF MANUFACTURING THE SAME

(75) Inventor: Yukiya Usui, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/703,728

(22) PCT Filed: Jun. 22, 2012

(86) PCT No.: PCT/JP2012/004073
§ 371 (c)(1),
(2), (4) Date: Dec. 12, 2012

(87) PCT Pub. No.: WO2012/176473
PCT Pub. Date: Dec. 27, 2012

(65) Prior Publication Data
US 2013/0193560 A1    Aug. 1, 2013

(30) Foreign Application Priority Data
Jun. 22, 2011    (JP) .................................. 2011-138359

(51) Int. Cl.
*H01L 29/40* (2006.01)
*H01L 21/311* (2006.01)

(52) U.S. Cl.
USPC .......................................... 257/774; 438/701

(58) Field of Classification Search
USPC .......... 438/640, 668, 701, 713; 257/621, 774, 257/E21.597
See application file for complete search history.

(56) References Cited

U.S. PATENT DOCUMENTS

| 4,847,183 | A |   | 7/1989 | Kruger |
| 5,506,141 | A | * | 4/1996 | Weinreb et al. ............ 435/309.1 |
| 5,546,375 | A |   | 8/1996 | Shimada et al. |
| 5,866,021 | A |   | 2/1999 | Yagi et al. |
| 6,774,340 | B1 |  | 8/2004 | Chiba et al. |

(Continued)

FOREIGN PATENT DOCUMENTS

| CN | 1881583 A | 12/2006 |
| JP | 5-93054 U | 12/1993 |

(Continued)

OTHER PUBLICATIONS

International Search Report for PCT/JP2012/004073 dated Jul. 31, 2012.

(Continued)

*Primary Examiner* — Calvin Lee
(74) *Attorney, Agent, or Firm* — Pearne & Gordon LLP

(57) ABSTRACT

A semiconductor substrate having dot marks is provided. Particularly, a semiconductor substrate having dot marks having an improved reading rate is provided. In a semiconductor substrate having a plurality of dot marks formed of recess portions having an inverted frustum shape, the plurality of dot marks constitutes a two-dimensional code disposed in a rectangular region of 0.25 $mm^2$ to 9 $mm^2$, the diameter W of the recess portion on the surface of the semiconductor substrate is 20 μm to 200 μm, is larger than the diameter w of the bottom surface of the recess portion, and is smaller than the thickness of the semiconductor substrate, the side surface of the recess portion has four or more trapezoidal flat taper surfaces, and the taper angle of the taper surface is in a range of 44° to 65° with respect to the surface of the semiconductor substrate.

10 Claims, 7 Drawing Sheets

(56) References Cited

U.S. PATENT DOCUMENTS

| | | | |
|---|---|---|---|
| 7,169,578 B2 * | 1/2007 | Wang et al. | 435/30 |
| 7,771,647 B2 * | 8/2010 | Jacobs et al. | 264/435 |
| 2003/0003608 A1 | 1/2003 | Arikado et al. | |
| 2006/0131424 A1 | 6/2006 | Helin et al. | |
| 2006/0278722 A1 | 12/2006 | Tominaga | |
| 2008/0014631 A1 * | 1/2008 | Muraguchi et al. | 435/288.7 |
| 2011/0195496 A1 | 8/2011 | Muraguchi et al. | |

FOREIGN PATENT DOCUMENTS

| | | | |
|---|---|---|---|
| JP | 05-335197 A | 12/1993 | |
| JP | 6-84455 A | 3/1994 | |
| JP | 9-80061 A | 3/1997 | |
| JP | 9-88061 A | 3/1997 | |
| JP | 2000-223382 A | 8/2000 | |
| JP | 2002-064214 A | 2/2002 | |
| JP | 2004-047776 A | 2/2004 | |
| JP | 2004-095814 A | 3/2004 | |
| JP | 2005-050889 A | 2/2005 | |
| JP | 2006-351620 A | 12/2006 | |
| JP | 2011-023615 A | 2/2011 | |
| WO | 2005/069001 A1 | 7/2005 | |

OTHER PUBLICATIONS

Extended European Search Report for application No. 12775424.0-1552/2560191 dated Aug. 27, 2013.

* cited by examiner

SEMICONDUCTOR SUBSTRATE HAVING DOT MARKS AND METHOD OF MANUFACTURING THE SAME

TECHNICAL FIELD

The present invention relates to a semiconductor substrate having dot marks and a method of manufacturing the same. The semiconductor substrate having dot marks of the invention can be used for a semiconductor substrate of a solar battery, but is not particularly limited thereto.

BACKGROUND ART

Guaranteeing the traceability of each and every wafer in a manufacturing process of solar batteries realizes quality improvement, high homogenization, and production rate improvement. Furthermore, guaranteeing the traceability can bring extremely large effects such as quality assurance in the respective processes, handling of recalls in the market, and feasibility of feedback toward the production process.

In wafer management of the related art in a production process of solar batteries, wafers supplied by wafer makers are divided into arbitrary lots, and production is performed in each of the lots through a cell production process. In order to identify the lots, marks that identify wafers having a link with the lots are formed using an electrode formation paste from an Ag paste material or the like in an electrode formation process at the final phase of the cell process. Thereby, management of processes after the electrode formation process and wafer management at lot level are realized (for example, refer to PTLs 1 and 2). Furthermore, a technique in which recess portions and protrusion portions are formed on the surface of the wafer in a cell of a solar battery, and a specific character pattern is formed using the recess portions and the protrusion portions, thereby identifying the cell using the character pattern is known (refer to PTL 3).

In addition, in order to align the crystal orientation of a semiconductor crystal substrate with the locations of the alignment mark formed on the mask, a technique in which the semiconductor crystal substrate is etched so as to form a processing mark is known (refer to PTL 4). In addition, a technique in which a microwell having an inverted cone shape or other shape is formed in a silicon substrate so as to manufacture a microwell chip is proposed (refer to PTLs 5 and 6). Furthermore, a method of manufacturing a microprobe or a micro tip including a process in which recess portions are formed on a single crystal silicon substrate is known (refer to PTLs 7, 8, 9, and 10).

Furthermore, a method in which marks formed of dot holes are formed on a silicon substrate in order to perform marking on the silicon substrate is known (refer to PTL 11). In addition, a technique in which an inverted pyramid-shaped pattern is formed on a silicon substrate, and the pattern is used as a mark is known (refer to PTL 12).

That is, in the past, in processes after a module process in a production process of solar batteries, the lot of a cell was identified by reading the mark, and, similarly, a serial number was attached to a module. Thereby, a mechanism by which identification of which cell from which lot was used in which module was possible has been employed.

CITATION LIST

Patent Literature

[PTL 1] JP-UM-A-5-93054
[PTL 2] JP-A-2002-64214
[PTL 3] JP-A-2004-47776
[PTL 4] JP-A-5-335197
[PTL 5] Pamphlet of International Publication WO. 2005/069001
[PTL 6] U.S. Patent Unexamined Application Publication No. 2008/0014631
[PTL 7] JP-A-9-080061
[PTL 8] JP-A-6-084455
[PTL 9] U.S. Patent Application Publication No. 5546375
[PTL 10] U.S. Patent Application Publication No. 5866021
[PTL 11] JP-A-2004-095814
[PTL 12] U.S. Patent Unexamined Application Publication 2006/0131424

SUMMARY OF INVENTION

Technical Problem

In the wafer management method in the production process of solar batteries of the related art, management at lot level is possible, but it is almost impossible to trace the detailed path of a process in the cell procedure. Therefore, even when the qualities of formed cells differ, it is extremely difficult to identify the cause of the quality difference from 1) materials, 2) the process, and 3) the manufacturing facilities. The above fact forms a large problem when attempting to improve production quality or promote high homogenization.

In addition, the semiconductor substrates of solar batteries can be divided into substrates using both surfaces as light-receiving surfaces and substrates using one surface as a light-receiving surface and having an electrode formed on the other surface. Moreover, the area of the light-receiving surface of a solar battery being as large as possible is advantageous in terms of power generation efficiency. Therefore, most of the surfaces of a semiconductor substrate in a solar battery, both the front surface and the rear surface, are processed. Therefore, a wafer which serves as a raw material of the semiconductor substrate in a solar battery has a limited area on which information for identifying the cell can be printed. That is, generally, there is no space on the surface of a wafer which serves as a raw material of a semiconductor substrate in a solar battery, the space being large enough to print characters that are large enough for people to recognize.

Furthermore, a cell manufacturing flow of a solar battery includes a plurality of etching processes and film formation processes. Therefore, there is a problem in that information marked on a wafer which serves as a raw material is lost after the above processes.

Therefore, the invention provides a semiconductor substrate including dot marks having an improved reading rate in order to solve the problems of the related art.

For example, when the semiconductor substrate of the invention is used as a raw material of a semiconductor substrate in a solar battery, it becomes possible to read information in the respective processes in a cell of a solar battery manufacturing flow. When the information on the semiconductor substrate can be read in the respective processes, the process management and process management of each and every cell in a cell manufacturing flow becomes possible. Thereby, it becomes possible to accelerate production quality improvement and promotion of high homogenization.

Solution to Problem

That is, a first aspect of the invention relates to a semiconductor substrate having dot marks exemplified below.

[1] A semiconductor substrate having a plurality of dot marks each formed of a recess portion having an inverted frustum shape, in which the plurality of dot marks constitutes a two-dimensional code disposed in a rectangular region of 0.25 mm² to 9 mm², the diameter W of the recess portion on the surface of the semiconductor substrate is 20 μm to 200 μm, is larger than the diameter w of the bottom surface of the recess portion, and is smaller than the thickness of the semiconductor substrate, the depth of the recess portion of the dot marks is smaller than the thickness of the semiconductor substrate, the side surface of the recess portion has four or more trapezoidal flat taper surfaces, and the taper angle of the taper surface is in a range of 44° to 65° with respect to the surface of the semiconductor substrate.

[2] The semiconductor substrate according to [1] above, in which the shape the recess portion on the surface of the semiconductor substrate is tetragonal, and the shape of the bottom surface of the recess portion is tetragonal or octagonal.

[3] The semiconductor substrate according to [1] above, in which the shape of the recess portion on the surface of the semiconductor substrate is octagonal, and the shape of the bottom surface of the recess portion is tetragonal or octagonal.

[4] The semiconductor substrate according to [1] above having information codes written using the plurality of dot marks.

[5] The semiconductor substrate according to [1] above having character information written using the plurality of dot marks.

[6] The semiconductor substrate according to [1] above, in which the plurality of dot marks is disposed at the circumferential edge portion of the surface of the semiconductor substrate.

[7] The semiconductor substrate according to [1] above, in which the plurality of dot marks forms a 16×16 dot pattern or an 18×18 dot pattern.

A second aspect of the invention relates to a method of manufacturing a semiconductor substrate having dot marks shown below and a cell of a solar battery.

[8] A method of manufacturing the semiconductor substrate according to [1] above including a process in which the semiconductor substrate is prepared, and a process in which a plurality of the recess portions is formed by emitting a laser to irradiate the surface of the semiconductor substrate.

[9] The manufacturing method according to [8] above further including a process in which the semiconductor substrate having the plurality of recess portions formed thereon is wet-etched.

[10] The manufacturing method according to [8] above, in which the semiconductor substrate is a single crystal silicon wafer.

[11] The manufacturing method according to [8] above, in which the semiconductor substrate is a (100)-oriented single crystal silicon wafer.

[12] A method of manufacturing a cell of a solar battery including the semiconductor substrate according to [1] above including a process in which the semiconductor substrate is prepared, a process in which a plurality of dot marks formed by the recess portions is formed by emitting a laser to irradiate the surface of the semiconductor substrate, a process in which the semiconductor substrate having the plurality of recess portions formed thereon is wet-etched, and a process in which members necessary as a cell of a solar battery are provided on the semiconductor substrate having the recess portions, in which the dot marks formed of the plurality of recess portions are read after any of the processes included in the method of manufacturing the cell of a solar battery.

Advantageous Effects of Invention

The semiconductor substrate of the invention has a plurality of dot marks having a high degree of reading precision, moreover, the plurality of dot marks constitutes two-dimensional codes. Therefore, the mark reading rate is high in the management of the semiconductor substrate (for example, silicon wafer), moreover, it is possible to write a variety of information on the semiconductor substrate. Use of the semiconductor substrate of the invention can relate all processes to all wafers for the respective processes for each and every wafer, the all processes including a wafer manufacturing process, a cell manufacturing process of a solar battery, a module manufacturing process of a solar battery, a tracking process under a solar battery installation environment and so on. That is, it is possible to build a traceability system and a production management system.

DESCRIPTION OF EMBODIMENTS

1. Regarding a semiconductor substrate having dot marks

The semiconductor substrate of the invention has information written using dot marks. Typically, a code in which information is represented by patterned dots, and more specifically, a two-dimensional code is written. The written code is read using a reading apparatus installed in a process so that the precision of process management in a production flow of a device (for example, a solar battery) including the semiconductor substrate is improved.

The semiconductor substrate of the invention has a plurality of dot marks formed of inverted conic or inverted frustum-shaped recess portions, more preferably, inverted frustum-shaped recess portions on the surface. The inverted conic recess portion refers to a recess portion having the vertex at the bottom portion; and the inverted frustum-shaped recess portion refers to a recess portion having a surface at the bottom portion.

The semiconductor substrate of the invention is preferably a silicon wafer, and more preferably a silicon wafer having a crystal orientation of (100). And, the thickness of the semiconductor substrate having dot marks is appropriately set depending on the use, but, in a case in which the semiconductor substrate is used for a solar battery, the thickness is generally preferably in a range of 100 μm to 200 μm.

A single semiconductor substrate has a plurality of dot marks formed of the recess portions formed thereon. For example, marks of 16×16 dots or 18×18 dots are formed on the semiconductor substrate; and a plurality of marks of 16×16 dots or 18×18 dots may be formed on the semiconductor substrate. Thereby, a two-dimensional code is constituted. All of the dot marks constituting the two-dimensional code are preferably inverted frustum-shaped recess portions (refer to FIG. 2A) having a bottom surface.

The dot marks can be formed at arbitrary locations on the surface of the semiconductor substrate; however, the locations of the dot marks are set so that the marks are easily read, marking does not affect the quality of the semiconductor substrate, and the formed marks are not lost in the later working process of the semiconductor substrate. In consideration of the above fact, generally, the dot marks are disposed at the circumferential edge portion, preferably at the corner portion, of the surface of the semiconductor substrate.

Figure 1A:
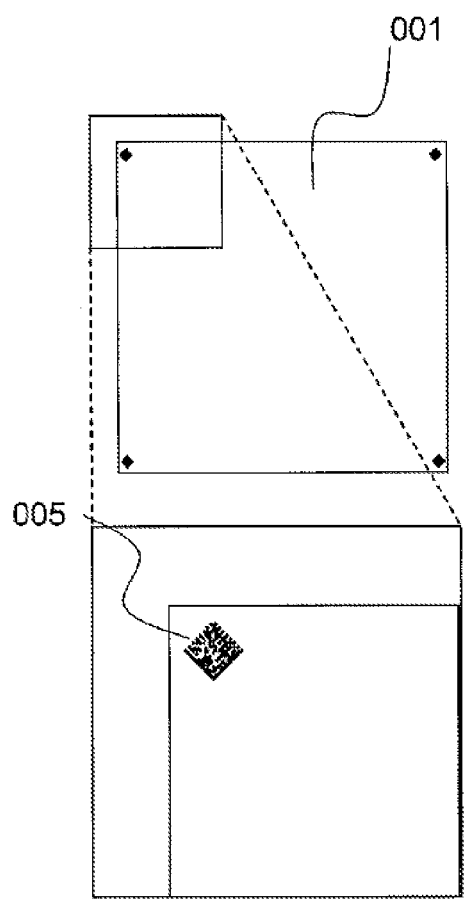
FIG. 1 is a view showing an example of a two-dimensional mark cede using dots drawn on a silicon wafer.
Figure 1B:
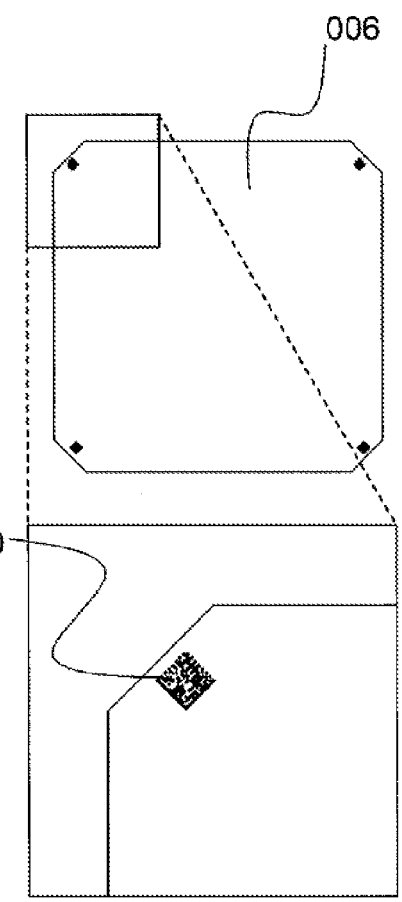

FIGS. 1A and 1B show a state in which a plurality of dot marks is formed on the corner portion of the semiconductor substrate. In FIG. 1A, a two-dimensional code 005 termed a data matrix formed of a plurality of dot marks is printed on the surface of the semiconductor substrate (single crystal silicon wafer 001). Similarly, in FIG. 1B, a two-dimensional code 010 termed a data matrix formed of a plurality of dot marks is printed on the surface of the semiconductor substrate (single crystal silicon wafer 006).

The two-dimensional codes 005 and 010 are disposed in rectangular regions respectively. The area of the rectangular region is preferably 0.25 mm² to 9 mm², and is preferably, for example, approximately 1 mm². In the two-dimensional codes 005 and 010, marks of 16×16 dots or 18×18 dots are preferably formed in the rectangular regions.

The sides of the rectangular regions in which the two-dimensional codes 005 and 010 are disposed are not parallel to four sides of the semiconductor substrate (single crystal silicon wafers 001 and 006), but is inclined at 45°. In addition, a part of the corner of the semiconductor substrate (single crystal silicon wafer 006) is cut.

The two-dimensional codes 005 and 010 are preferably disposed in regions on the surface of the semiconductor substrate, which makes little or no contribution to power generation. The area of the region is preferably as small as possible. In consideration of the above fact, the plurality of dot marks is preferably formed in a rectangular region having sides parallel to the cutting edge at the corner of the semiconductor substrate as shown in FIG. 1B.

The recess portions constituting the dot marks need to have a high reading precision by a reading apparatus, and to be as minute as possible.

Figure 2A:
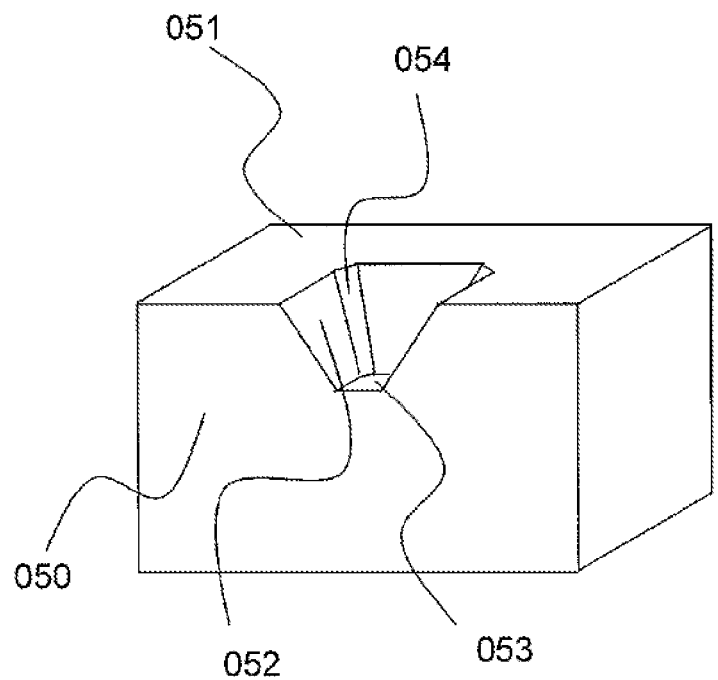
FIG. 2 is a perspective view of the dot mark drawn on the silicon wafer.
Figure 2B:
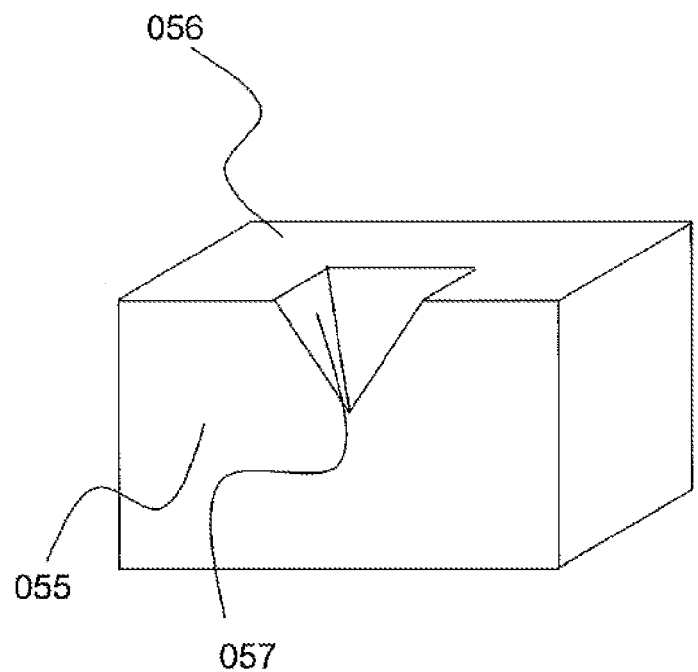

FIGS. 2A and 2B show the perspective views of dot marks formed of a recess portion formed on a silicon wafer (050 and 055). FIG. 2A shows an example of a dot mark formed of an inverted frustum-shaped recess portion, and FIG. 2B shows an example of an inverted conic dot mark. A preferable dot mark is an inverted frustum-shaped recess portion as shown in FIG. 2A. This is because such a dot mark has a high reading precision by a reading apparatus. As shown in FIGS. 2A and 2B, the inverted conic recess portion refers to a recess portion having the vertex at the bottom portion; and the inverted frustum-shaped recess portion refers to a recess portion having a surface at the bottom portion.

As shown in FIGS. 2A and 2B, the side surfaces of the recess portion constituting the dot mark has a taper shape, and is inclined against the substrate surface. The side surfaces of the recess portion have four or more trapezoidal taper surfaces (single crystal silicon (111) surface 052) (FIG. 2A) or four or more triangular taper surfaces (single crystal silicon (111) surface 057) (FIG. 2B).

Figures 3A, 3B:
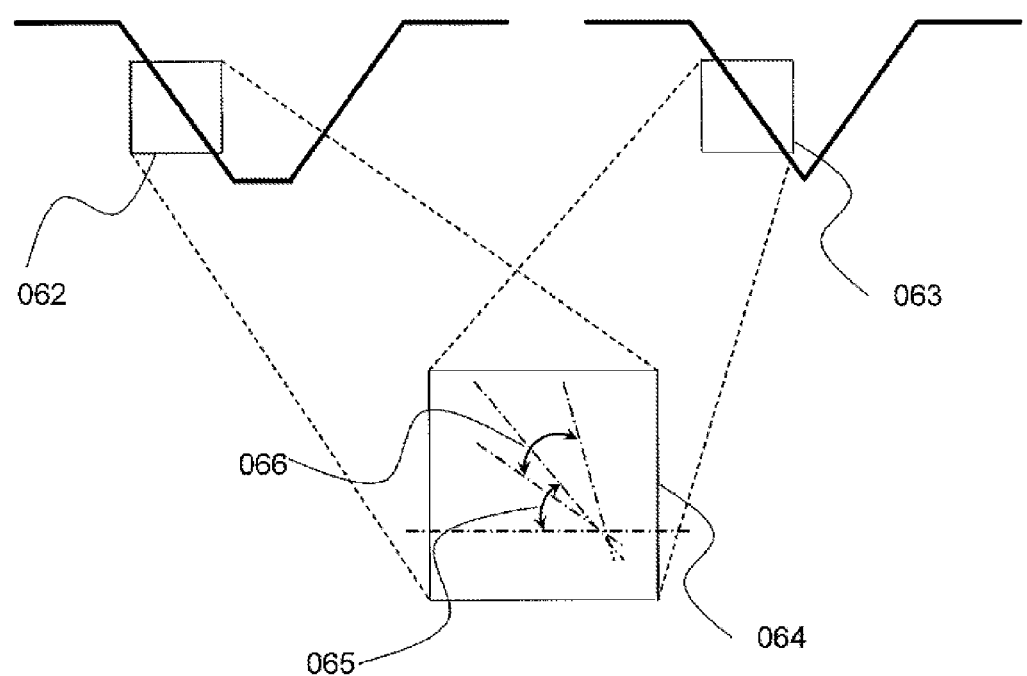
FIG. 3 is a view showing the inclination angle of inside wall of the dot mark drawn on the silicon wafer.

FIGS. 3A and 3B show the cross-sectional view of the recess portion constituting the dot mark. FIG. 3A shows an example of a dot mark formed of an inverted frustum-shaped recess portion, and FIG. 3B shows an example of an inverted conic dot mark. In both cases, the side surfaces (062 and 063) of the recess portion are inclined against the substrate surface. As shown in the enlarged view of 064, the inclination angle 065 is typically in a range of 54° to 55°, and the variation 066 of the inclination angle 065 is preferably ±10°. Therefore, the inclination angle 065 is preferably in a range of 44° to 65°.

The reading precision by an optical reading apparatus is improved by appropriately setting the inclination angle 065. When the inclination angle 065 is provided to the inside surface of the recess portion constituting the dot mark, it becomes possible to make dot shape non-processed portions and dot shape processed portions on the wafer surface into bright portions and dark portions respectively, so as to differentiate both. As the inclination angle 065 increases, the difference in darkness between the dot shape non-processed portions and the dot shape processed portions becomes evident, therefore reading using a reading apparatus becomes easy. Therefore, the inclination angle 065 is preferably 44° or more.

Meanwhile, when the inclination angle 065 is excessively large, it is also necessary to excessively increase the depth of the recess portion in order to maintain the diameter of the recess portion constituting the dot mark at a certain size or more. In order to excessively increase the depth of the recess portion, it is also necessary to excessively increase the depth of the semiconductor substrate, which is not preferable. Therefore, the inclination angle 065 is preferably in a range of 44° to 65°.

The optical reading apparatus for reading the dot marks irradiates the dot marks from above the dot-marked portions with light using a ring lighting so as to make the dot shape non-processed portions and the dot shape processed portions into bright portions and dark portions respectively, so as to differentiate both. The contrast of the bright and dark portions differs depending on the diameter of the ring lighting, lighting installation distance, and lighting illuminance. Selection and the installation location of the ring lighting may be set depending on the inclination angle 065 of the inside wall of the recess portion and variation of the angle.

Figures 4A, 4B:
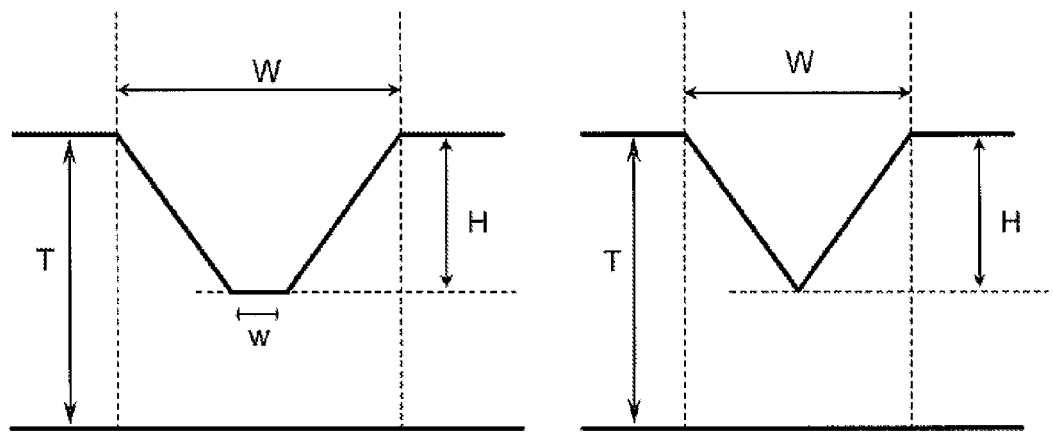
FIG. 4 is a view showing the diameter and depth of the recess portion and the diameter of the bottom surface of the dot mark drawn on the silicon wafer.

FIGS. 4A and 4B show the cross-sectional view of the recess portion constituting the dot mark. FIG. 4A is a cross-sectional view of a dot mark formed of an inverted frustum-shaped recess portion, and FIG. 4B is a cross-sectional view of an inverted conic dot mark. As shown in FIGS. 4A and 4B, the diameter (the aperture of the recess portion on the surface of the semiconductor substrate) W of the recess portion constituting the clot mark is preferably in a range of 20 μm to 200 μm. In addition, the diameter W of the recess portion is preferably smaller than the thickness T of the semiconductor substrate. In addition, the depth H of the recess portion constituting the dot mark is preferably smaller than the thickness T of the semiconductor substrate, but is preferably 20 μm or more. Furthermore, the diameter w of the bottom surface of the recess portion is preferably 20 μm or less.

The reading precision of the dot mark by a reading apparatus can be improved depending on settings of the diameter W and depth H of the recess portion and the diameter w of the bottom surface. That is, reflection and absorption of light are stabilized during the lighting irradiation of an optical reading apparatus, and consequently, the reading rate of the dot mark can be improved. As described above, the reading precision or the reading rate is easy to increase with a dot mark formed of an inverted frustum-shape recess portion than with a dot mark formed of an inverted conic recess portion. Therefore, the recess portions of all the dot marks constituting a two-dimensional code preferably have an inverted frustum shape.

The diameter W and depth H of the recess portion and the diameter w of the bottom surface of the recess portion can be adjusted by adjusting the diameter and depth of the recess portion formed on the surface of the semiconductor substrate by laser irradiation or adjusting the etching time as described below.

Using a plurality of dot marks formed on the surface of the semiconductor substrate, it is possible to write a data matrix or a QR code (registered trademark) which is a typical two-dimensional code, and additionally, character information or signals formed on the semiconductor substrate using dots. Moreover, it is possible to write the above in an extremely minute region. In a case in which the semiconductor substrate is used for, for example, manufacturing of a solar battery, information written on the semiconductor substrate includes information of the production base, information of the production line, information of the type of a solar battery to be manufactured, information of the production time, and the like.

2. Regarding a method of manufacturing a semiconductor substrate having dot marks A semiconductor substrate having the dot marks of the invention includes 1) a process in which a semiconductor substrate is prepared, 2) a process in which a plurality of recess portions is formed by emitting a laser to irradiate the surface of the semiconductor substrate, and, more preferably, 3) a process in which the semiconductor substrate having the recess portions formed thereon is wet-etched.

As described above, the semiconductor substrate being prepared is preferably a single crystal silicon wafer, and is preferably a single crystal silicon wafer having a crystal orientation of (100). The thickness is not particularly limited, and a semiconductor substrate having a desired thickness may be prepared depending on the set thickness of the semiconductor substrate included in a final product.

The recess portions are formed by emitting a laser to irradiate the surface of the semiconductor substrate. The formation of the recess portions is not particularly limited, and may be performed using a green laser processor. The green laser refers to a laser oscillating a green ray near a wavelength of 532 nm.

As described below, the semiconductor substrate having the recess portions formed thereon by laser irradiation is exposed to a plurality of etching processes and film formation processes. And, the shape (depth, diameter, and the like) of the recess portion changes over the etching processes and the film formation processes. Therefore, the diameter or depth of the recess portion formed by laser irradiation is adjusted so that dot marks formed of the recess portions become readable after the entire processes including the plurality of etching processes and film formation processes.

Figure 5A:
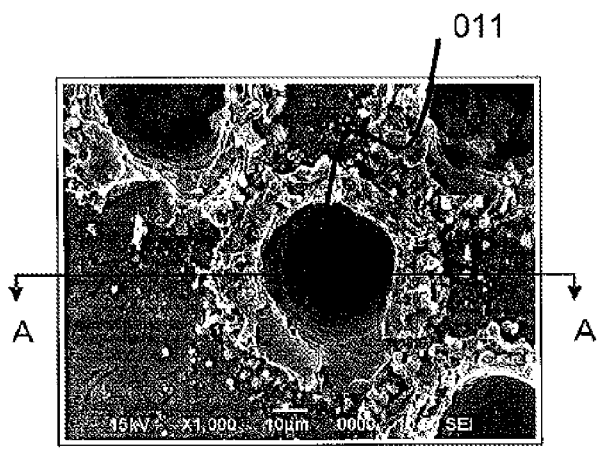
FIG. 5 is a view showing the state of the recess portions formed by emitting a laser to irradiate the silicon wafer (FIGS. 5A to 5C), and a read image obtained using a reading apparatus of a data matrix formed of the recess portions (FIG. 5D).

In addition, the shape of the recess portion formed by laser irradiation is, for example, a circle as shown in FIG. 5A, but is not particularly limited, and may be rectangular such as square or oblong or other shape.

Figures 5B, 5C:
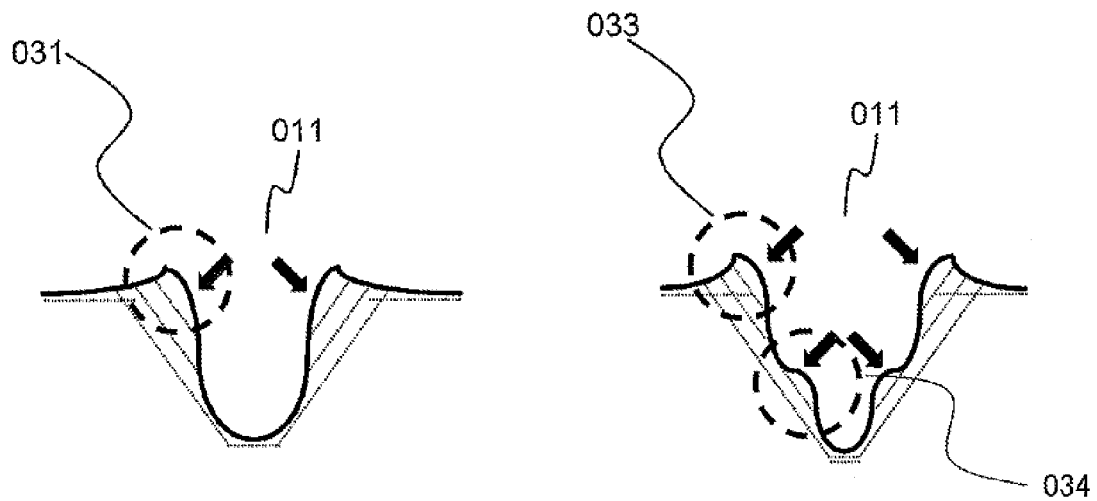

Examples of the recess portion 011 formed by laser irradiation are shown in FIGS. 5A to 5C. FIG. 5A is a SEM image seen from above the recess portion 011, and FIGS. 5B and 5C are views schematically showing the cross section of the recess portion 011 along the A-A line in FIG. 5A. As shown in FIGS. 5A to 5C, burrs (031 and 033) are caused around the recess portion 011.

In addition, the inside wall of the recess portion 011 sometimes forms a "smooth curved surface" as shown in the cross-sectional view of the recess portion of FIG. 5B, but sometimes forms a "curved surface including a plurality of recesses and protrusions" as shown in the cross-sectional view of the recess portion of FIG. 5C so as to have protrusion portions 034.

Figure 5D:
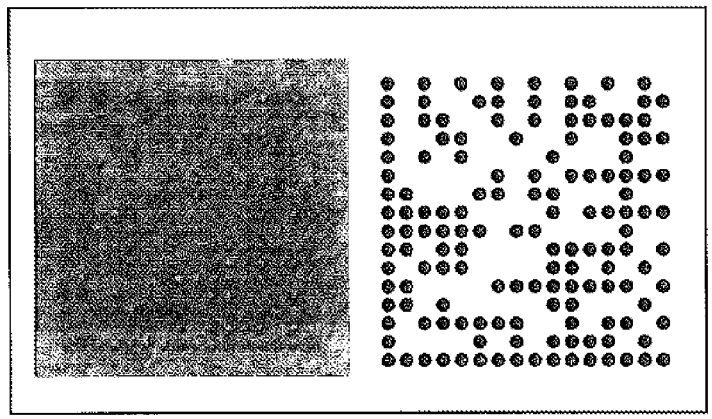

An image of the dot mark formed of the recess portion 011 shown in FIG. 5A read using an optical reading apparatus is shown in FIG. 5D. The left view in FIG. 5D is a code photograph read using a reading apparatus, and the right view in FIG. 5D is a code view that is supposed to be read. As is evident from the left view in FIG. 5D, the code photograph read using an optical reading apparatus is unclear, and reading is difficult. One of the reasons is the presence of the burrs (031 and 033, refer to FIGS. 5B and 5C) around the recess portion 011 or the presence of the "curved surface including a plurality of recesses and protrusions (refer to FIG. 5C)" on the inside surface of the recess portion which diffusely reflects reflected light rays.

Therefore, the shape of the recess portion 011 is optimized through wet etching of the semiconductor substrate having the recess portions 011 formed thereon by laser irradiation. An etchant for the wet etching differs depending on the kind of the semiconductor substrate, but is preferably an alkaline etchant in a case in which the semiconductor substrate is a silicon wafer having a crystal orientation of (100).

The semiconductor substrate having the recess portions 011 formed thereon is treated using an alkaline etchant (for example, immersed in an alkaline etchant) so that the burrs (031 and 033) at the recess portion 011 are removed, and the inside surface of the recess portion 011 is flattened.

The etching of the semiconductor substrate using an alkali etchant can be an essential process in a production process of a solar battery. For example, in an ordinary silicon solar battery manufacturing flow, a damaged layer (process-modified layer) or an oxide layer of a commercially available silicon wafer is alkali-wet-etched. The shape of the recess portion Oil formed by laser irradiation can be processed in synchronization with the alkali etching.

The silicon wafer having a crystal orientation (100) is anisotropically etched using an alkaline etchant. Specifically, the surface (052 in FIG. 2A and 057 in FIG. 2B) of the crystal orientation (111) is etched more easily than the surface (051 and 053 in FIG. 2A, and 056 in FIG. 2B) of the crystal orientation (100) and the surface (054 in FIG. 2A) of the crystal orientation (221). Therefore, the recess portion 011 formed by laser irradiation becomes the recess portion 014 shown in FIGS. 6A to 6C through the alkali etching.

Figure 6A:
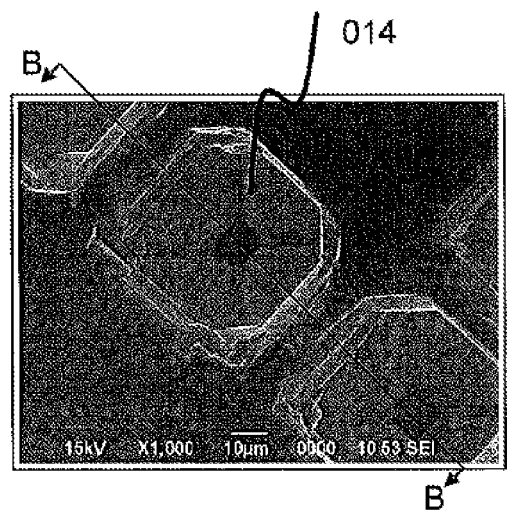
FIG. 6 is a view showing the state of the recess portions formed through wet etching of the recess portions formed by emitting a laser to irradiate the silicon wafer (FIGS. 6A to 6C), and a read image obtained using a reading apparatus of a data matrix formed of the recess portions (FIG. 6D).
Figure 6B:
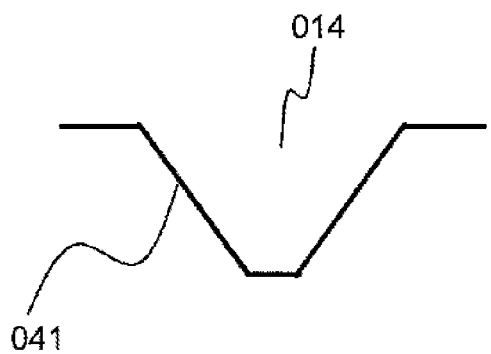
Figure 6C:
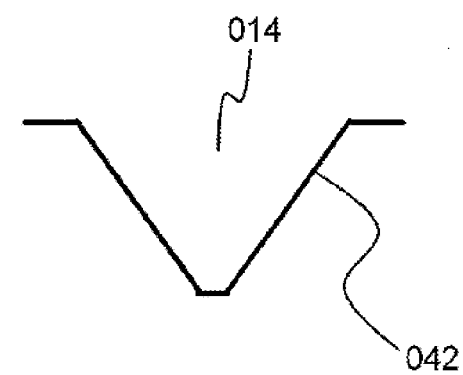

FIG. 6A is a SEM image of the etched recess portion 014 seen from above, and FIGS. 6B and 6C are views schematically showing the cross section of the recess portion 014 along the B-B line in FIG. 6A. As shown in FIGS. 6A to 6C, burrs are not present in the recess portion 014, and the inside surface (041 and 042) of the recess portion 014 forms a flat taper surface.

As such, a recess having a burr or protrusion-appearing dot shape, such as the recess portion 011 (refer to FIG. 5), formed on a single crystal silicon wafer using a laser becomes a dot shape having a burr-free flat inclined surface such as the recess portion 014 (refer to FIG. 6) through the etching process.

Figure 6D:
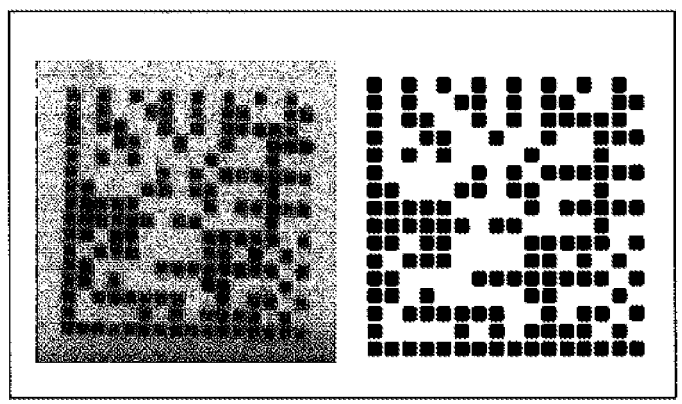

An image of the dot mark formed of the recess portion 014 shown in FIG. 6A read using an optical reading apparatus is shown in FIG. 6D. The left view in FIG. 6D is a code photograph read using a reading apparatus, and the right view in FIG. 6D is a code view that is supposed to be read. As is evident from FIG. 5D and comparison with FIG. 5D, the code photograph of the dot mark formed of the recess portion 014 read using an optical reading apparatus becomes clearer than the code photograph of the dot mark formed of the recess portion 011 read using an optical reading apparatus.

As described above, the invention removes the burrs present at the recess portion formed by laser irradiation through wet etching, makes the strained side surface of the recess portion into a flat inclined surface, and produces a recess portion having a desired shape. Thereby, variation in the shapes of the recess portions decreases, and the reflection direction of light rays is also specified. Thereby, the reading time of a code printed with dot marks formed of the recess portions is shortened, and the reading rate of the code improves.

Figure 7:
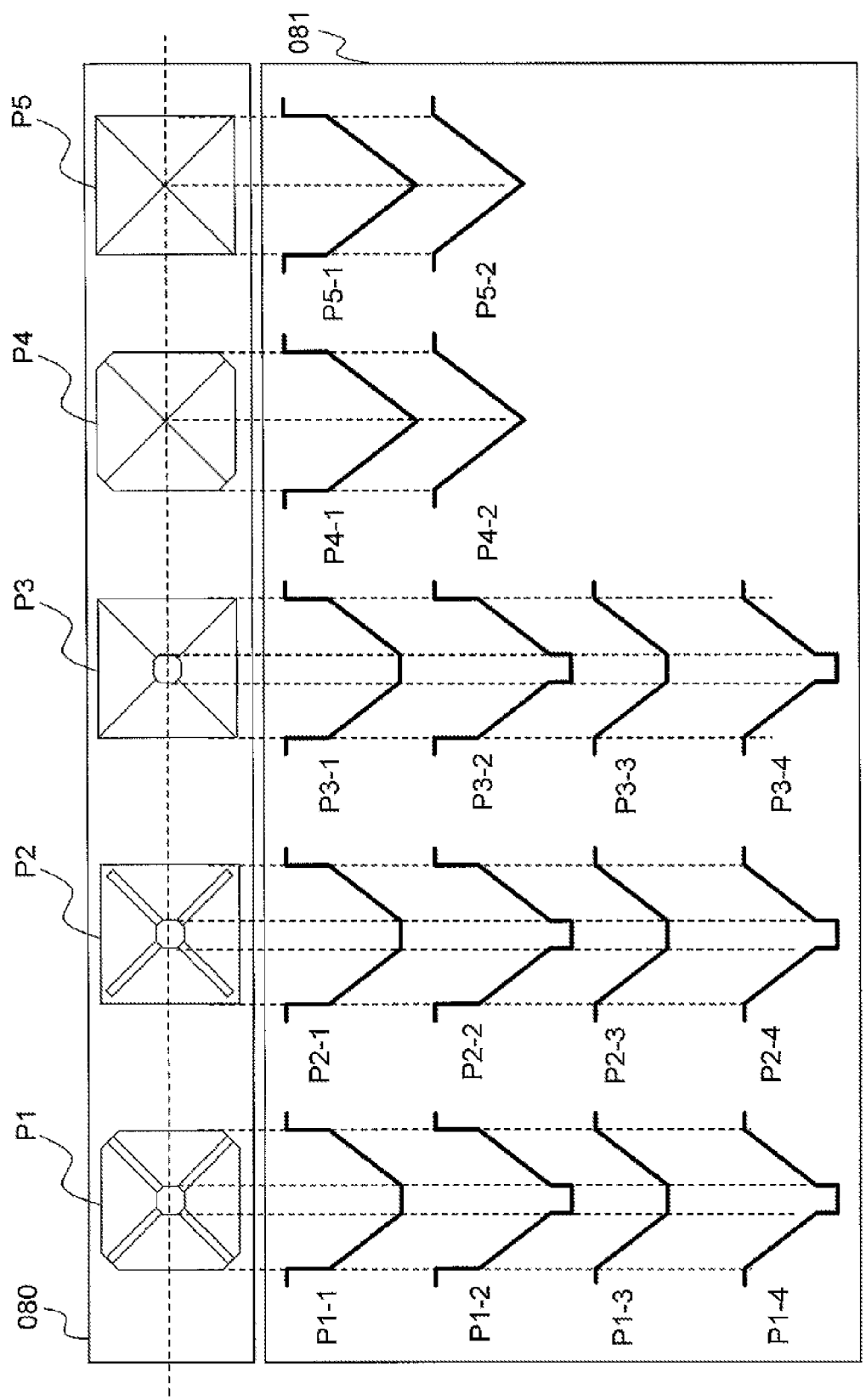
FIG. 7 is a view showing the patterns of dot marks drawn on the silicon wafer.

The shape of the recess portion 014 is further processed through additional alkaline wet etching which is essentially performed in a production process of a solar battery. FIG. 7 shows the shapes of the recess portions. The top view in FIG. 7 shows the shapes of the recess portion observed from above, and the bottom view in FIG. 7 shows the cross section of the recess portion at the broken line in the top view.

Firstly, the recess portion 014 (refer to FIG. 6) is formed through the first alkali etching process from the recess portion 011 (refer to FIG. 5) formed by laser irradiation. The shape of the recess portion 014 can be shown in P1. However, depending on the shape (diameter, depth, and the like of the recess portion 011) of the recess portion 011 formed by laser irradiation and the conditions of the alkali etching process, there are cases in which the recess portion has any shape of P2 to P5.

The shape of the formed recess portion 014 frequently changes in the order of P2, P3, P4, and P5 states from the state of P1, but also changes in the order of, for example, P1→P4→P5 or P1→P2→P3→P5.

The recess portion shown in P1 in FIG. 7 is octagonal at both the opening portion and the bottom surface. The side surface of the recess portion includes at least four trapezoidal flat taper surfaces and rectangular surfaces present between the trapezoidal flat taper surfaces. In addition, the side surface of the recess portion shown in P1 may include surfaces other than the above surfaces. For example, P1-1 and P1-2 has side surfaces from the opening portion which are vertical to the substrate surface, and P1-2 and P1-4 has side surfaces from the bottom surface which are vertical to the substrate surface.

The recess portion shown in P2 in FIG. 7 is square at the opening portion, and octagonal at the bottom surface. The shape of the opening portion is further changed through additional alkali etching so that the recess portion shown by P1 becomes the recess portion shown in P2. The recess portion shown in P2 is the same as the recess portion shown in P1 except that the opening portion is square.

The recess portion shown in P3 in FIG. 7 is square at the opening portion, and octagonal or square at the bottom surface. The side surface of the recess portion has four trapezoidal flat taper surfaces. Unlike the side surface of the recess portion shown in P2, the recess portion shown in P3 does not have rectangular surfaces present between the trapezoidal flat taper surfaces. The recess portion shown in P3 is the same as the recess portion shown in P2 except the above.

The recess portion shown in P4 in FIG. 7 is octagonal at the opening portion, and has the vertex at the bottom surface. The recess portion shown in P5 in FIG. 7 is square at the opening portion, and has the vertex at the bottom surface. As such, the surface present at the bottom of the recess portion is lost through etching. As described above, the reading precision by a reading apparatus is easy to increase in inverted frustum-shaped recess portions having a bottom surface as shown in P1 to P3 than inverted conic recess portions having the vertex as shown in P4 and P5.

As such, the shape of the recess portion changes each time the etching process is performed, and the depth of the recess portion changes when the film formation process is performed. Therefore, the etching amount of each etching process and the film thickness in the film formation process are obtained in advance; and the shape (diameter and depth) of the recess portion formed by laser irradiation is adjusted so as to form a desired recess portion in accordance with the data obtained in advance. Thereby, it is possible to guarantee the stable reading of dot marks formed of the recess portions until the final process.

EXAMPLES

A single crystal silicon wafer for a solar battery was prepared. The crystal orientation of the prepared single crystal silicon wafer was (100), and the wafer thickness was 180 µm.

A plurality of recess portions was formed at the corner portion of a single crystal silicon wafer using a green laser processor (green laser marker LP-G series, manufactured by Panasonic Electric Works SUNX Co., Ltd., wavelength of 532 nm) so as to print a two-dimensional code termed a data matrix expressed by a plurality of dot shapes. The target diameter of the recess portion formed in the single crystal silicon wafer was 50 µm, and the target depth of the recess portion was 60 µm. The shape of the recess portion formed through laser processing is shown as SEM photograph in FIG. 5A.

In the example, the data matrix code printed using a laser was disposed in a 1 mm×1 mm rectangular region. The dot number (cell number) printed was 16×16. The location at which the data matrix was printed is shown by 005 in FIG. 1A or by 010 in FIG. 1B.

The single crystal silicon wafer on which the data matrix was printed using a laser was wet-etched. An alkali-containing aqueous solution was used as an etchant, and the single crystal silicon wafer was etched by immersing the single crystal silicon wafer in the etchant.

The shape of the wet-etched recess portion is shown as SEM photograph in FIG. 6A. The angle of the inner wall surface of the recess portion shown in FIG. 6A was approximately 54° to 55°.

For 100 pieces of wafer on which the data matrix formed of the recess portions formed through laser processing was printed and 100 pieces of wafer on which the data matrix was printed through wet etching of the above wafers, the reading rates by an optical reading apparatus was measured respectively.

For reading using the optical reading apparatus, the data matrix codes were irradiated using a ring lighting. The diameter of the used ring lighting was 20 mm to 50 mm in width. In addition, the installation distance of the ring lighting was set to 85 mm.

Of the pieces of 100 wafer on which the data matrix was printed, one wafer was arbitrarily selected, the lighting conditions appropriate for reading of the data matrix code printed on the selected wafer were adjusted, and the algorithm was adjusted, thereby performing reading. Under the adjusted conditions, the data matrix codes printed on the rest 99 pieces of wafer were read. And, from how many of the 100 pieces of wafer the printed data matrix could be read was confirmed. The confirmation was performed repeatedly a plurality of times.

As a result, while the reading rates of the data matrix codes printed only through laser processing was 30% to 50%, the reading rate of the data matrix codes printed through additional wet etching was 99% or more.

INDUSTRIAL APPLICABILITY

Dot marks provided on the semiconductor substrate having marks of the invention can be stably read using an optical reading apparatus. Moreover, the dot marks provided on the semiconductor substrate having marks of the invention can be provided in an extremely small region. Therefore, according to the semiconductor substrate having marks of the invention, management of the manufacturing process of a solar battery (for example, a silicon solar battery) having a semiconductor substrate becomes possible.

Furthermore, other than management of the manufacturing process of a solar battery, it is possible to supply information to semiconductor substrates for a variety of uses. For example, the invention can be also applied to management of a semiconductor wafer on which character information was printed in a semiconductor process in the past.

In addition, when dot marks are formed into a matrix shape on a semiconductor substrate (silicon wafer) at narrow pitches, a texture structure can be regularly formed on a surface of the substrate. It is possible to control the size of a texture formed after wet etching by controlling the excavating depth by laser processing.

REFERENCE SIGNS LIST 001, 006 SINGLE CRYSTAL SILICON WAFER
005, 010 TWO-DIMENSIONAL CODE PRINT
011, 014 RECESS PORTION
031, 033 BURR AT RECESS PORTION DURING LASER PROCESSING
034 PROTRUSION PORTION ON SIDE SURFACE OF RECESS PORTION DURING LASER PROCESSING
041, 042 SIDE SURFACE OF ETCHED RECESS PORTION
050, 055 SINGLE CRYSTAL SILICON WAFER
051, 056 SINGLE CRYSTAL SILICON (100) SURFACE
052, 057 SINGLE CRYSTAL SILICON (111) SURFACE
053 SINGLE CRYSTAL SILICON (100) SURFACE
054 SINGLE CRYSTAL SILICON (221) SURFACE
062, 063 SIDE SURFACE OF RECESS PORTION
064 ENLARGED VIEW
065 INCLINATION ANGLE
066 VARIATION
W RECESS PORTION APERTURE
H RECESS PORTION DEPTH
w DIAMETER OF BOTTOM SURFACE OF RECESS PORTION

The invention claimed is:

1. A semiconductor substrate having a plurality of dot marks each formed of a recess portion having an inverted frustum shape,
   wherein the plurality of dot marks constitutes a two-dimensional code disposed in a rectangular region of 0.25 mm$^2$ to 9 mm$^2$,
   a diameter W of the recess portion on a surface of the semiconductor substrate is 20 µm to 200 µm, is larger than a diameter w of a bottom surface of the recess portion, and is smaller than a thickness of the semiconductor substrate,
   a depth of the recess portion of the dot marks is smaller than the thickness of the semiconductor substrate,
   a side surface of the recess portion has four or more trapezoidal flat taper surfaces, and a taper angle of the taper surface is in a range of 44° to 65° with respect to the surface of the semiconductor substrate, wherein information codes are or character information is written in the semiconductor substrate using the plurality of dot marks.

2. The semiconductor substrate according to claim 1,
   wherein a shape of the recess portion on the surface of the semiconductor substrate is tetragonal, and
   a shape of the bottom surface of the recess portion is tetragonal or octagonal.

3. The semiconductor substrate according to claim 1,
   wherein a shape of the recess portion on the surface of the semiconductor substrate is octagonal, and a shape of the bottom surface of the recess portion is tetragonal or octagonal.

4. The semiconductor substrate according to claim 1,
   wherein the plurality of dot marks is disposed at a circumferential edge portion on a surface of the semiconductor substrate.

5. The semiconductor substrate according to claim 1,
   wherein the plurality of dot marks forms a 16×16 dot pattern or an 18×18 dot pattern.

6. A method of manufacturing the semiconductor substrate according to claim 1 comprising:
   a preparing step of the semiconductor substrate; and
   a forming step of a plurality of the recess portions by emitting a laser to irradiate the surface of the semiconductor substrate.

7. The manufacturing method according to claim 6, further comprising:
   a wet-etching step of the semiconductor substrate having the plurality of recess portions formed thereon.

8. The manufacturing method according to claim 6,
   wherein the semiconductor substrate is a single crystal silicon wafer.

9. The manufacturing method according to claim 6,
   wherein the semiconductor substrate is a (100)-oriented single crystal silicon wafer.

10. A method of manufacturing a cell of a solar battery including the semiconductor substrate according to claim 1 comprising:
    a preparing step of the semiconductor substrate,
    a forming step of a plurality of the recess portions by emitting a laser to irradiate the surface of the semiconductor substrate,
    a wet-etching step of the semiconductor substrate having the plurality of recess portions formed thereon, and
    a providing step of members necessary as a cell of a solar battery on the semiconductor substrate having the recess portions,
    wherein the dot marks formed of the plurality of recess portions are read after any process included in the method of manufacturing a cell of a solar battery.

* * * * *